United States Patent [19]
Wolfe et al.

[11] Patent Number: 6,063,246
[45] Date of Patent: *May 16, 2000

[54] METHOD FOR DEPOSITING A CARBON FILM ON A MEMBRANE

[75] Inventors: John Charles Wolfe; James Richard Wasson; Jose Leonel Torres Bucardo, all of Houston, Tex.

[73] Assignee: University of Houston, Houston, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/862,770

[22] Filed: May 23, 1997

[51] Int. Cl.$^7$ .............................. C23C 14/34; C23C 14/48
[52] U.S. Cl. ............................... 204/192.16; 204/192.26; 430/5; 427/523; 427/526
[58] Field of Search ......................... 204/192.15, 192.16, 204/192.26; 430/5; 427/533, 535, 523, 525, 530, 526

[56] References Cited

U.S. PATENT DOCUMENTS

| | | | |
|---|---|---|---|
| 4,448,865 | 5/1984 | Bohlen et al. | 430/5 |
| 4,597,844 | 7/1986 | Hiraki et al. | 204/192.15 |
| 4,767,517 | 8/1988 | Hiraki et al. | 204/192.15 |
| 4,915,746 | 4/1990 | Welsch | 427/528 |
| 5,679,431 | 10/1997 | Chen et al. | 204/192.2 |

FOREIGN PATENT DOCUMENTS 2-051215  2/1990  Japan .

OTHER PUBLICATIONS

Appl. Phys. Lett 55 (6), Aug. 7, 1989 "In situ grown TBa$_2$Cu$_3$O$_{7-d}$ thin films from single–target magnetron sputtering"; 1989 American Institute of Physics; Eom et al.
"Control of temperature gradients and distrotion of ion projection lithography masks"; Birman et al.
Optik 62, No. 1 (1982) "Mask life investigation in an ion–optical proximity printer" U. Vehringer and R. Speidel.
J. Appl Phys. vol. 68, No. 4, Aug. 15, 1990; "The properties of a–C:H films deposited by bias sputtering of carbon" J.W. Zou et al.
J. Appl. Physx. 79 (9), May 1, 1996; "Properties of carbon ion deposited tetrahedral amorphous carbon films as a function of ion energy" Shi Xu et al.
Thin Solid Films, 189 (1990) 257–267; "Polymer–Like and Hard Amorphous Hydrogenated Carbon Films Prepared in an Inductively Coupled R.F. Glow Discharge"; W. Dworschak et al.
J. Vac. Sci. Technol. A 12(f) Jul./Aug. 1994; "Deposition of diamondlike carbon using a planar radio frequency induction plasma"; D.L. Pappas et al.
J. Vac. Sci. Technol. A 12(3), May/Jun. 1994; "Thickness–dependent stress in sputtered carbon films"; M.K. Puchert et al.; 1994 American Vacuum Society.
Mat. Res. Soc. Symp. Proc. vol. 308—1993 Materials Research Society; "Dependence of Residual Stress of Diamond–Like Carbon Films on Precursor Gases and Process Parameters of RF PACVD"; Kwang–Ryeol Lee et al.

(List continued on next page.)

*Primary Examiner*—Rodney McDonald
*Attorney, Agent, or Firm*—Thomas R. Vigil

[57] ABSTRACT

A method for depositing carbon films on membranes used in masks for X-ray or corpuscular projection, e.g. electron or ion beam, lithography is proposed in which sputtering is used and the membranes serving as sputter substrates are positioned in the off-axis configuration relative to the sputter targets. The carbon films thus produced have a compressive stress of the order of 10 MPa or below. For modifying the properties of carbon films after deposition, e.g. the deactivation of chemically reactive sites or stabilization of stress, ion bombardment with helium ions can be employed. This method anticipates changes in the film due to initial irradiation and serves to reach a plateau in which the stress varies only a little, i.e. within about 1 MPa or less.

9 Claims, 4 Drawing Sheets

OTHER PUBLICATIONS

J. Appl. Phys. 79 (3), Feb. 1, 1996; 1996 American Institute of Physics; "Tetrahedral amorphous carbon films prepared by magnetron sputtering and dc ion plating"; J. Schwan et al.

J. Vac. Sci. Technol. A 14(4) Jul./Aug. 1996; 1996 American Vacuum Society; Effect of energetic particles on the residual stress in nonhydrogenated amorphous carbon films deposited on grounded substrates by dc magnetron sputtering E. Mounier; et al.

Vacuum/vol. 34/No. 1–2 pp. 153 to 156/1984; "Come mechanisms of sputtered negative ion production"; M.C. Underwood, Naclear Physics Laboratory.

International Journal of Mass Spectrometry and Ion Physics, 25 (1977) 71–87; "Energy Distribution of Negative Ions Sputtered from Caesiated Surfaces" G. Doucas; Nuclear Physics Laboratory, University of Oxford.

J. Vac. Sci. Technol. A, vol. 11, No. 4, Jul./Aug. 1993; "Removing the energetic neutral problem in sputtering"; B. Window.

Thin Solid Films, 171 (1989) 5–31; "Stress–Related Effects in Thin Films"; John A. Thornton and D.W. Hoffman.

Optical Engineering/Mar./Apr. 1983/vol. 22 No. 2; "Measurement of long radius of curvature"; Murty and Shukla.

J. Electrochem. Soc.: Solid–State Science and Technology; vol. 119, No. 4, Apr. 1972; "Internal Stress in Multilayered Structures"; P.B. Ghate and Lou H. Hall.

Japanese Journal of Applied Physics; vol. 21, No. 5, May, 1982, pp. 688–95.

"Energy Analysis of High–Energy Neutral Atoms in the Sputtering of ZnO and $BaTiO_3$"; by K. Tominaga et al.

J. Electrochem. Soc.: Solid–State Science and Technology; "An Optical Imaging Method for Wafer Warpage Measurements"; by K.H. Yang; May 1985.

J. Vac. Sci. Technol. B, vol. 1, No. 4, Oct.–Dec. 1983; "A technique for the determination of stress in thin films"; E.I. Bromley et al.

Am. J. Phys. vol. 59, No. 7, Jul. 1991; "Newton's rings: A classroom demonstration with a He–Ne laser"; A.F. Leung and J.E. Lee.

Meas. Sci. Technol 2. (1991) 780–84; "Comparative radius of curvature measurement by non–contact Newton's rings"; S.Y. El–Zaiat et al.

Mat. Res. Soc. Symp Proc. vol. 130 1989 Materials Research Society; "Principles and Applications of Wafer Curvature Techniques For Stress Measurements in Thin Films"; Paul A. Flinn.

G. Stoney, Proc. Roy Soc. (London) A82, 172 (1909); Dislocation Arrays in Heterogeneous Materials; "Measurement of Strains at $Si–SiO_2$ Interface"; R.J. Jaccodine and W.A. Schlegel; Bell Telephone Laboratories, Inc.

J. Vac. Sci. Technol. B7 (6), Nov./Dec. 1989; 1989 American Vacuum Society; "Fabrication of low–stress silicon stencil masks for ion beam lithography"; Sudipto Sen et al.

Patent Output; U.S. Pat. No. 5,415,756; "Ion assisted deposition process including reactive source gassification"; by John C. Wolfe et al.; issued May 16, 1995.

METHOD FOR DEPOSITING A CARBON FILM ON A MEMBRANE

BACKGROUND OF THE INVENTION

1. Field of the Invention

The invention concerns membranes employed in X-ray and corpuscular projection lithography, e.g. as part of a stencil mask for ion-beam lithography.

2. Background of the Invention

In the manufacturing of e.g., semiconductors, X-ray and corpuscular beam lithography is used. Corpuscular beams include electrons, ions, but also neutral atoms and ionic or neutral molecules, e.g. hydrogen ions, $H_3^+$. In projection lithography membranes of various materials for masks to pattern the beam are used. The materials of these membranes can be of any material that can be formed as a thin layer and structured, including semiconductors, e.g. single-crystal α-silicon or polycrystalline silicon, metals, e.g. nickel, and insulators, e.g. silicon dioxide or aluminum oxide, many other materials can be, and are, used in the art. The life time of these membranes is limited by the effects of damage incurred to the membranes during irradiation. As for ion-beam lithography, a bare silicon membrane, which can be patterned and used as a stencil mask, can only withstand a total charge density of 0.2 $mC/cm^2$ of irradiated ions before its intrinsic stress changes drastically. To meet the needs of future lithography in VLSI and ULSI circuits, a mask will have to be capable of withstanding up to ten million exposures. This is approximately the number of exposures that can take place between design generations. The ion dose required to fully expose photoresist is approximately $5 \times 10^{12}$ ions/$cm^2$. Therefore a stencil mask used in a proximity printer would be bombarded with $5 \times 10^{19}$ ions/$cm^2$ or 8 $C/cm^2$ after ten million exposures. The ion beam could also be magnified or de-magnified as with an ion projection lithography system. With a demagnification of 4x, the stencil mask would be bombarded with $3.125 \times 10^{18}$ ions/$cm^2$, which equates with a total charge density of 500 $mC/cm^2$ at the stencil mask.

It has been shown previously that silicon membranes swell during lithium ion bombardment due to ion implantation into the silicon crystal interstitial positions. Hydrogen or helium ions bombarding a silicon membrane also cause swelling which, in this case, is the main cause for stress change in the membrane. Hydrogen diffuses out of the silicon membrane when the temperature is set to 450° C. for approximately 30 minutes, while helium diffuses out of the silicon membrane at a temperature of 700° C. for approximately 8 hours. After the thermal treatment, the silicon membrane returns to its original tension for small doses, e.g. about 0.2 $mC/cm^2$; for higher doses, the membrane is permanently damaged.

With masks of a material different from silicon, the problem stays in principle unchanged, although the extent of stress change due to irradiation can vary and even reverse, e.g. silicon dioxide shows a compaction rather than swelling upon irradiation with hydrogen, helium or argon ions. It is obvious that this phenomenon is not limited to the irradiation with ions but also with electrically neutral atoms or molecules. Moreover, since the lattice is affected by not only the implantation of atoms or molecules, but also the impact of the energetic radiation itself, stress change effects will prevail also for irradiation with electrons or high-energy electromagnetic radiation, as e.g. X-rays. The following discussion mainly refers to ion projection lithography, but it is understood that the considerations presented in the following also apply, with only minor adaptions, as e.g. taking the respective equivalent doses of irradiation, for the more general case of X-ray and corpuscular projection lithography.

In order to increase the life of a pattern mask used for ion-beam lithography, it is necessary to prevent the mask from swelling/compaction. This is usually done by means of protective coatings, as described in the Bohlen et al. U.S. Pat. No. 4,448,865, an ideal ion-absorbing coating is characterized by the following properties:

a) the stress of the ion-absorbing coating should be in the order of or less than that of the silicon membrane;

b) the stress of the ion-absorbing coating should not change more than 10% when implanted with hydrogen or helium ion doses exceeding 1 $C/cm^2$, c) the stress of the ion-absorbing coating should not change more than 10% when stored under typical clean-room conditions for periods up to 1 year;

d) the deposition and patterning of the ion-absorbing coating should be compatible with the mask fabrication sequence.

Especially the last requirement eliminates many potential candidates for the ion-absorbing layer. Carbon is a candidate film for this application since it can be easily patterned in oxygen; as additional advantages, it has only gaseous oxides and a high emissivity of between 0.7 and 0.8.

One technique to apply low-stress carbon films is sputtering. Another possible technique employs electron beam evaporation. The normal mode of sputtering is to place the substrate directly above the sputtering target. This so-called "on-axis" sputtering has been used extensively for the deposition of carbon films. However, carbon films produced by "on-axis" sputtering are diamond-like, have very high compressive stress, and should, when bombarded with ions, exhibit the problems discussed above, i.e., trapping of ions leading to swelling of the membrane, as well. Since implanted gasses cannot diffuse out of these films at room temperature, they are not suitable as ion-absorbing layers. The compressive stress of a diamond-like carbon film would also severely distort and/or destroy a membrane. The thin silicon membranes from which lithography masks are made have inherently about 10 MPa of tensile stress, whereas the intrinsic stress of diamond-like carbon is compressive and between 1 GPa and 14 GPa. In the conventional sputtering configuration, negative ions generated at the cathode bombard the substrate and create highstress, diamond-like material. Carbon has been used as a conductive layer and to prevent sputtering, but carbon has not been applied for protecting e.g. silicon from ion implantation. Recently, however, a new sputter deposition technique, known as "off-axis" sputtering, has been developed for depositing high temperature superconducting films. This technique uses a different geometry in that the deposition surfaces are positioned in the off-axis configuration relative to the sputter targets. The technique of "off-axis" sputtering has been used in the deposition of superconducting films, as described by Eom et al., Applied Physics Letters, vol. 55 (1989) p. 595.

It is an object of the present invention to provide a method to apply a carbon layer to membranes whose stress is small in comparison to the inner stress of the original membrane. It is another object of the present invention to provide a treatment to a carbon layer such that upon subsequent exposure, its stress does not change more than 10% with irradiation doses exceeding the equivalent of 500 $mC/cm^2$. The present invention further aims at a carbon layer to membranes, e.g. silicon membranes, used in ion-beam lithography in which the implanted gasses can diffuse out of the coating layer before swelling of the layer occurs.

SUMMARY OF THE INVENTION

A method is proposed for depositing carbon films on membranes used in masks for X-ray or corpuscular lithography, in which sputtering is used and the membranes serving as sputter substrates are positioned in the off-axis configuration relative to the sputter targets. In this configuration, the sputter gun faces away from the substrate and the sputtered particles diffuse onto the substrate. In this configuration, the sputtered particles will arrive at the substrate with energies low enough in order to produce films of the desired stress properties and low density.

In order to ensure good uniformity and maximum deposition rates, the operating pressure used in the above-described method is less than 30 mtorr. Furthermore, a temperature of the sputter targets above 550° C. prevents the formation of insulating coatings on the target which may lead to arcing and reduce the sputtering rate; best results were obtained in the temperature range between 600° C. and 1800° C.

For modifying the properties of carbon films after deposition, e.g. the deactivation of chemically reactive sites or stabilizing of stress, ion bombardment with helium ions can be employed. This method anticipates changes in the film due to initial irradiation and serves to reach a plateau in which the stress varies only little, i.e. within an interval of about 1 MPa or less. The ion energies are chosen conveniently such that the projected range of the helium ions corresponds to the thickness of the carbon coating, but is still less, in order to avoid implantation to the membrane beneath the carbon film. In practice it was found that the minimum dose for the conversion is about 120 mC/cm$^2$.

It is an important property of the invention presented chat the carbon coating films thus produced have a compressive stress of the order of 10 MPa or below, which is low in comparison with that of the diamond-like films produced by methods well-known, and that this stress can be stabilized in the sense of the already mentioned plateau.

One important field of use for these carbon-coated membranes is ion projection lithography. For protection of the membrane, it is advantageous when the membrane has at least such a thickness, that ion penetration into the membrane is prevented at the ion energies intended.

If radiation cooling of the membrane is important, the emissivity of the coating film has to be large. Although the emissivity of a film coating according to this invention will not be the same as the bulk emissivity of carbon, which is 0.7 to 0.8, it was found that emissivity values above 0.5 can easily be obtained, and an emissivity of 0.75 is reached for a film approximately one micron thick.

DESCRIPTION OF THE PREFERRED EMBODIMENT(S)

Figure 1:
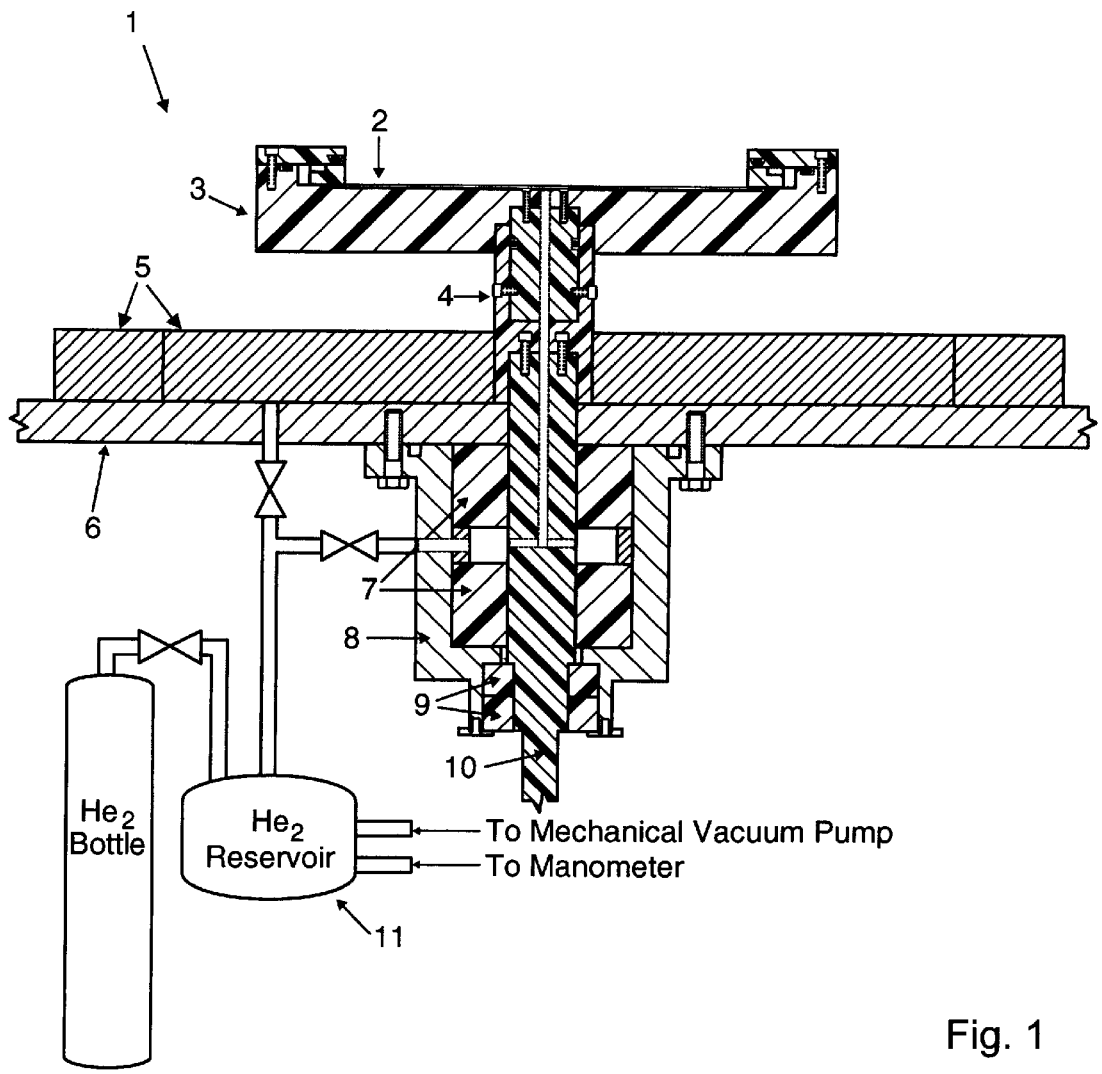
FIG. 1 is a schematic overview of an "off-axis" sputtering assembly for carbon films according to the present invention.

In the "off-axis" configuration, the substrate is mounted in such a way within the sputtering chamber that the at least one sputter gun, also mounted in the sputtering chamber and comprising each an anode and a sputter target working as a cathode, faces away from the substrate surface where the film is to be deposited. An example of a sputtering assembly is shown in FIG. 1 and discussed in the Examples section. The main deposition mechanism is diffusion of the sputter material in the gas within the sputtering chamber held at low pressure as described below. The sputtered particles are scattered by gas molecules and reach the substrate after having undergone several scattering collisions, the average number of collisions determined by the geometry and gas pressure of the sputter assembly. This deposition mechanism makes sure that the sputtered particles have low energies of deposition on the substrate. High-energy negative ions generated at the cathode, e.g. negative carbon ions, are prevented from bombarding the substrate. In the invention presented, the sputter target material is graphite. The graphite targets need to be heatable and heat-controlled so as to meet the process conditions described below. On the other hand, it is recommended that the temperature of the substrate, which may be a delicate pattern structuring, be kept at ambient temperature.

To apply a porous ion-absorbing carbon film with low stress, the gas pressure within the sputter chamber needs to be between 1 mtorr and 30 mtorr. Using the "off-axis" configuration requires a low operating pressure so that sputtered atoms have a sufficiently long mean free path to be scattered onto the substrate. At 30 mtorr, a sputtered atom will typically have made several tens of scattering collisions and would be redeposited on or near the target. At pressures exceeding 30 mtorr, the mean free path of a sputtered atom is further reduced and deposition is severely obstructed.

It was discovered that DC sputtering of a cold graphite target generated severe arcing. This is probably due to the formation of an insulating carbon layer on the target due to argon ion bombardment. This layer forms an insulator which becomes electrically charged by the electrons travelling in the race track of the target. When this charging effect has produced a voltage higher than the breakdown voltage of the insulating coating, an arc will travel through the coating These arcs generate particulate defects in the carbon film and prevent a stable deposition. Arcing may also extinguish the plasma by consuming the secondary electrons needed to sustain the plasma and, even worse, the arc can eject macroscopic particles from the target, which will severely -degrade the performance of the carbon film. We have found that arcing is completely absent if the target is operated at temperatures above 500° C., whereas the substrate is kept at ambient temperature throughout. We believe that a high target temperature converts the insulating coating to graphite. Sputtering on hot targets is described in the Chau et al. U.S. Pat. No. 5,415,756. Coatings have been formed with target temperatures between 600° C. and 2400° C. High temperatures were previously used to evaporate insulating target coatings in DC relative sputtering, but evaporation is clearly not the mechanism of removal of (insulating) coatings in this case.

Whilst the visual appearance of carbon films deposited by "on-axis" sputtering are shiny and/or glassy, and black or gray in color, the carbon films deposited by the "off-axis" sputtering are dull and black in color. The hardness of an "on-axis" film is much greater than the hardness of an "off-axis" film. The increased hardness of an "on-axis" film can be attributed to atomic peening of the substrate by negative carbon ions and reflected sputter gas neutrals. The densities of "off-axis" films were found to be in the range of 1.5 g/cm$^3$ which is distinctly lower than that of bulk graphite, namely 2.2 g/cm$^3$.

The thickness of the carbon film to be deposited can be up to several $\mu$m, and will be chosen according to the intended energy of irradiation. For ion-beam exposure, the thickness of the film should be such that the ions are absorbed within the carbon coating and do not reach the membrane underneath. For instance, a layer of about 0.5 $\mu$m is assumed to be sufficient in this aspect for hydrogen or helium ions of 10 kev.

Figure 2:
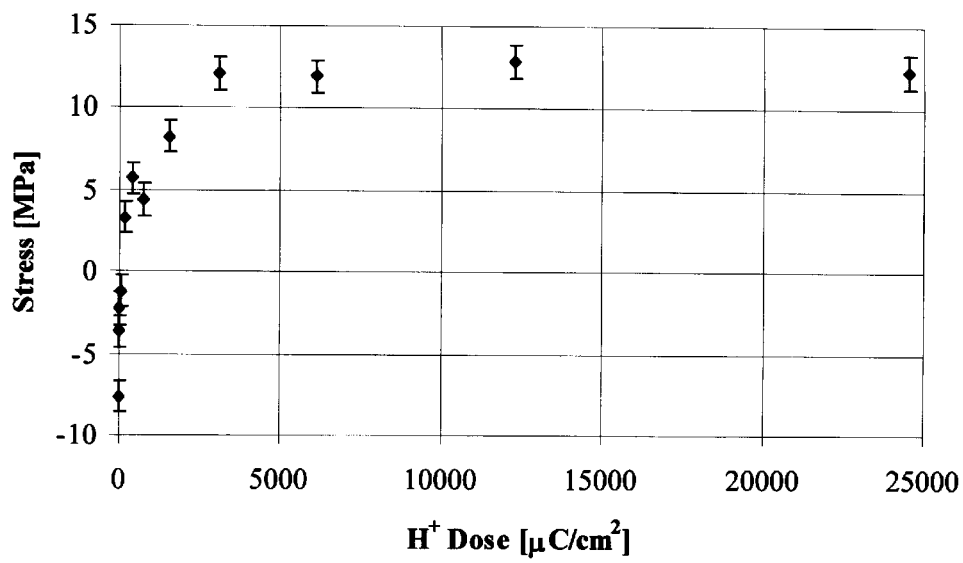
FIG. 2 shows the dependence of membrane stress as function of the ion dose of a silicon membrane coated with 0.5 μm carbon film and bombarded with hydrogen ions at an energy of 10 keV per ion.

When a silicon membrane is covered with a protective carbon film, the total stress in the membrane is lowered depending on the film thickness. However, when the membrane is exposed to hydrogen (or helium) ions, the stress in the membrane increases to a plateau. FIG. 2 shows the dependence of the membrane stress as a function of the hydrogen ion dose for a silicon membrane coated with 0.5 $\mu$m carbon film. The membrane was bombarded with hydrogen ions at an energy of 10 keV per ion. The plateau reached is approximately 12 MPa of tensile stress. It was found that the stress in the membrane maintained this plateau value until the proton dose delivered to the membrane was approximately 25 mC/cm$^2$, i.e., 1.536×10$^{17}$ protons. With this charge density, the membrane could be used to perform approximately 500,000 exposures in a 4× lithography system, given that 5×10$^{12}$ ions/cm$^2$ are needed to fully expose photoresist. All stress values of the figures are given in MPa.

It was observed that carbon etching occurs upon hydrogen bombardment, but the detailed mechanism is not yet clear. As a possible hypothesis, after the hydrogen implanted has lost enough energy, hydrogen and carbon form a hydrocarbon such as methane, $CH_4$, which out-gasses from the surface and is pumped off, this process leading to an increase of the film porosity and thus influencing the behavior shown in FIG. 2.

EXAMPLE

An example for a sputter assembly for deposition of carbon films on e.g. silicon masks according to the present invention is depicted schematically in FIG. 1. The assembly 1 uses five Research S-guns 5 (Sputtered Films, Inc.), each containing an anode and a graphite sputter target and capable of 2.4 kilowatts of dc power dissipation. The S-guns 5 are evenly positioned in a ten-inch diameter circle on a base plate 6 with the substrate 2 placed on a substrate holder 3 at the center. The substrate 2 is electrically floating and can be cooled with helium gas from a helium reservoir 11 through the substrate holder 3. The substrate holder 3 rotates during deposition, and is driven via a shaft 10 to which it is connected through a TEFLON® (polytetrafluoroethylene) coupler 4 mounted to the base plate 6 using a spacer sleeve 8 and thrust bearings 9 and vacuum-sealed by means of FERROFLUIDIC™ seals 7. The assembly is housed in a 58 cm diameter by 47 cm tall stainless-steel chamber (not shown in FIG. 1) which the base plate 6 is a part of, and is pumped by a cryogenic pump (CTI-10, Cryogenic Inc.). The deposition rate typically is in the range between 1 and 2.5 microns/hour, depending upon operating pressure and sputter power.

Figure 3:
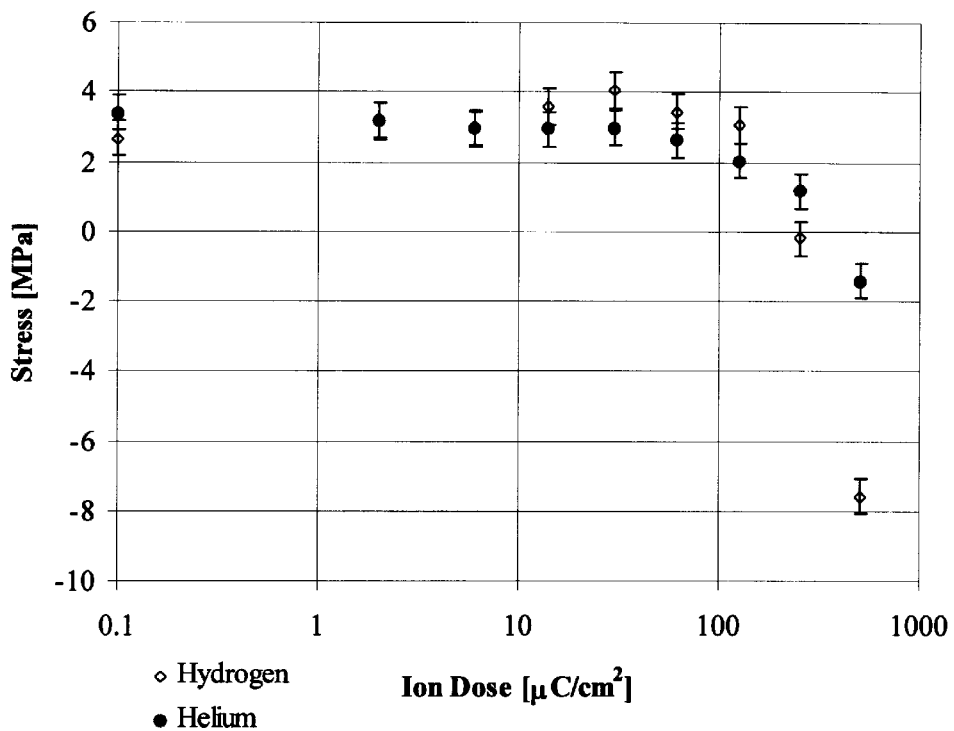
FIG. 3 shows the dependence of membrane stress as function of the ion dose of two bare silicon membranes, one bombarded with hydrogen ions at an energy of 10 keV per ion, the other bombarded with helium ions at an energy of 30 keV per ion.

For comparison, an example of bare silicon membranes is displayed in FIG. 3 showing the dependence of mask stress on ion dose for bare silicon membranes bombarded by 10 kev hydrogen, represented by circles, and 30 kev helium ions, represented by diamonds. A charge dose of only 0.2 mC/cm$^2$ is needed to completely remove the initial tension of the membrane.

The stress values given here have been determined by contact-free measuring the distortion of the membrane using a laser upon creating a bulging of the membrane by applying different pressures at either side of the membrane. The stress in the carbon layer was determined from measurement of the total stress and comparison with that of the bare membrane.

Figure 4:
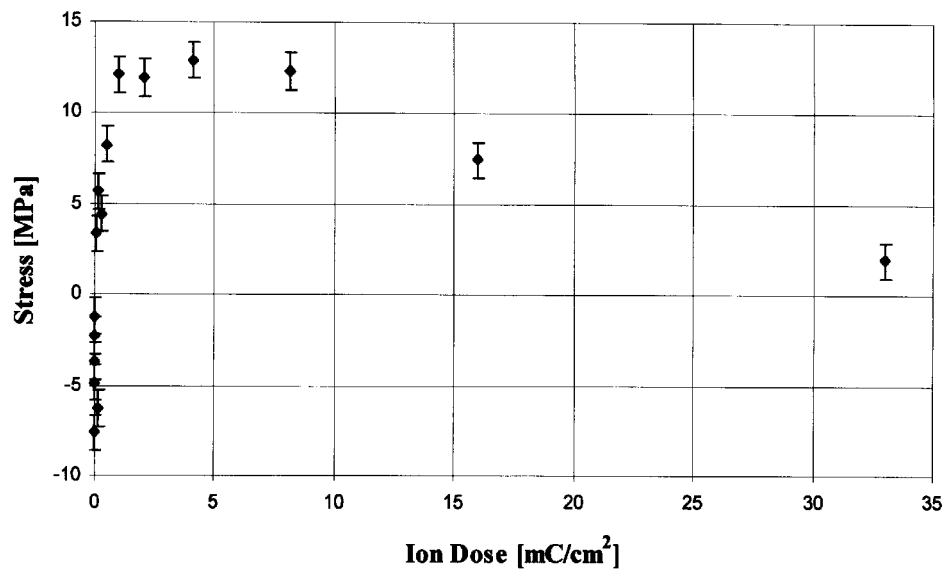
FIG. 4 shows the dependence of membrane stress as a function of the ion dose of a silicon membrane coated with 0.5 μm carbon film and bombarded with hydrogen ions at an energy of 10 keV per ion.

FIG. 4 shows the dependence of membrane stress on charge dose for a 2.5 $\mu$m thick silicon membrane with a 0.5 $\mu$m thick protective carbon coating bombarded by 10 keV hydrogen ions. The initial stress of the carbon film is about $-90$ MPa (negative values denote compressive stress). This compression is probably not an intrinsic property of the deposited film, but is caused by the absorption of water vapor by active sites in the film. The film is a form of "activated carbon." However, when the membrane is exposed to hydrogen ions with an energy of 10 keV per proton, the stress of the composite membrane increases to a plateau of about 12 MPa indicating that the film tension is about 32 MPa. This could be due to desorption of water vapor, but other processes may be involved. The membrane maintained this stress value until the charge dose delivered to the membrane/film was approximately 25 mC/cm$^2$. With this charge density, the membrane could be used to make approximately 500,000 exposures in a 4× lithography system, assuming a resist sensitivity of 5×10$^{12}$ ions/cm$^2$.

For doses greater than 10 mC/cm$^2$, the stress becomes increasingly compressive because ions are penetrating through the carbon layer into the silicon. The carbon layer is visibly thinner than the initial coating. We believe that reactive etching of the carbon by hydrogen forming volatile hydrocarbons such a methane, $CH_4$ is responsible for the thinning of the carbon layer. The use of hydrogen as an ion source is not ideal due to the volume etching of the applied film. Studies were therefore begun with helium, which clearly will not have this problem. Therefore, the next experiment involved implanting the carbon film using helium ions at 20 keV.

Figure 5:
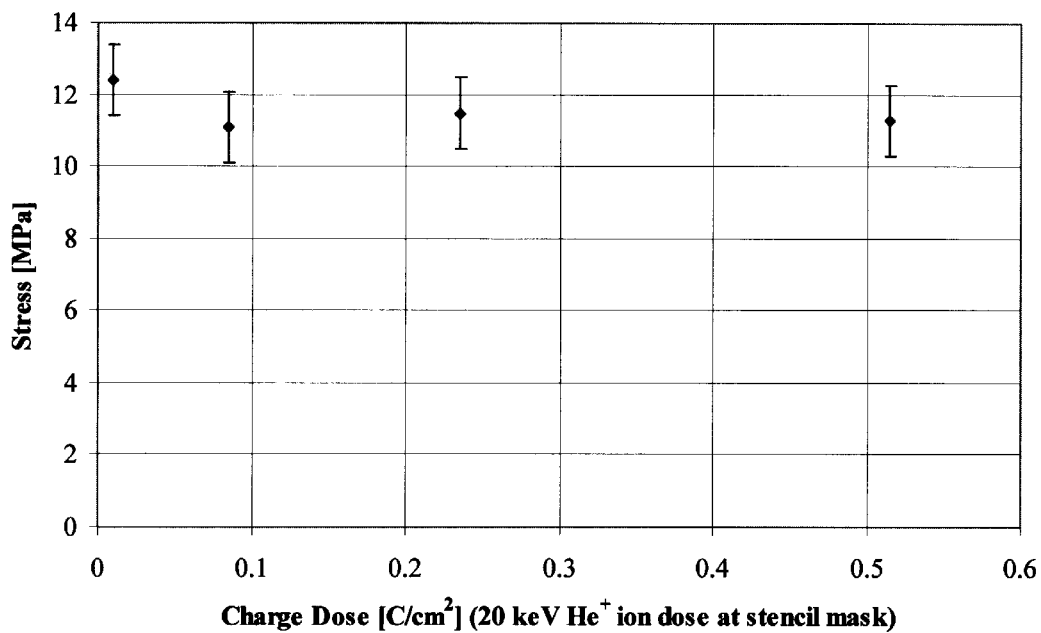
FIG. 5 shows the dependence of the stress of a 2.5 μm thick silicon membrane with a 1.0 μm thick protective carbon coating membrane upon irradiation with helium ions at an energy of 20 keV per ion. The membrane was initially irradiated with helium ions at an energy of 80 kev to a dose of 5 mC/cm$^2$ and then at an energy of 30 kev to an additional dose of 0.6 C/cm$^2$.

FIG. 5 shows the behavior of the membrane stress during helium bombardment of a 2.5 $\mu$m thick silicon membrane with a 1.0 $\mu$m thick protective carbon coating membrane The film was initially bombarded using helium ions by 80 keV ions with a dose of 0.005 C/cm$^2$. The energy was chosen so that the ions would convert nearly the entire carbon layer without penetrating into the silicon. The voltage was then reduced to 30 keV and 0.6 C/cm$^2$ were applied. The voltage was now decreased to 20 keV, and FIG. 5 shows the stress data taken during the irradiation with these 20 kev helium ions up to 0.835 C/cm². The stress was then stable, within experimental error, up to a total dose of 1.44 C/cm². The corresponding number of die exposures is also indicated in FIG. 5, an ion dose of 0.1 C/cm² equating with 1.6 million die exposures in a 4× projection lithography system, assuming a 1 μC/cm² resist dose.

Figure 6:
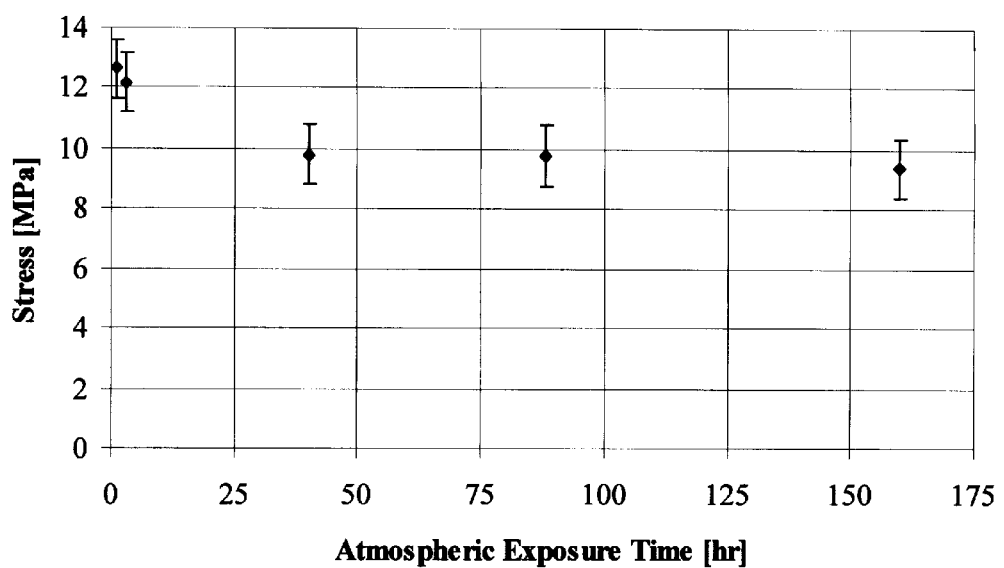
FIG. 6 shows behavior of the membrane stress during atmospheric exposure of a membrane after irradiation with helium ions at an energy of 20 kev to a dose of 0.25 C/cm$^2$.

After this procedure, the behavior of the membrane stress under atmospheric conditions was taken. FIG. 6 shows the stress in the carbon film of the membrane drawn over the time of atmospheric exposure. The stress varies by less than 3 Mpa over a period of 160 hours. This small variation is believed to be due to a region of unbombarded carbon surrounding the converted region. This demonstrates that the initial activated carbon film had been converted to one which is environmentally stable for at least one week.

It will be recognized that the present invention is not to be limited to the specific form(s) described above; rather, it is understood that other embodiments can be found without departing from the spirit and scope of the invention defined in the following claims.

We claim:

1. A method for depositing a porous carbon film, on a membrane where the membrane is used in ion projection lithography, by itself or as part of a lithography stencil mask, the method comprising the steps of:

placing the membrane into a position to serve as a sputter substrate;

positioning said membrane in an off-axis configuration;

providing at least one sputter target comprising graphite carbon; and, depositing the porous carbon film on the membrane by sputtering from the sputter target onto the membrane which is positioned in the off-axis configuration relative to said at least one sputter target to provide on said membrane an ion absorbing, porous carbon film having a thickness sufficient to prevent lithography ions from penetrating through the porous carbon film and into the substrate.

2. The method as claimed in claim 1 wherein said at least one sputter target has a temperature which is greater than 550° C.

3. The method as claimed in claim 2 wherein the temperature of said at least one sputter target is between 600° C. and 1800° C.

4. The method as claimed in claim 1 wherein said sputtering is performed under an operating pressure which is less than 30 mtorr.

5. The method according to claim 1 wherein the carbon film produced is modified by implanting with helium ions by helium ion bombardment at helium ion energies such that said helium ions have a projected range of implantation no greater than the thickness of said carbon film.

6. The method as claimed in claim 5 wherein a minimum dose of helium ion bombardment for the modification desired is 120 mC/cm².

7. The method as claimed in claim 5 wherein said carbon film has a compressive stress of 10 MPa or less.

8. The method as claimed in claim 1 wherein said carbon film has a thickness of 0.5 microns or greater.

9. The method as claimed in claim 5 wherein said membrane is made of silicon.

* * * * *